United States Patent
Engebretsen et al.

(10) Patent No.: US 9,141,501 B2
(45) Date of Patent: *Sep. 22, 2015

(54) FIRMWARE GENERATED REGISTER FILE FOR USE IN HARDWARE VALIDATION

(71) Applicant: LENOVO ENTERPRISE SOLUTIONS (SINGAPORE) PTE. LTD., Singapore (SG)

(72) Inventors: David R. Engebretsen, Cannon Falls, MN (US); Stephen A. Knight, Rochester, MN (US); Jaimeson Saley, Rochester, MN (US); Bruce Wile, Poughkeepsie, NY (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 49 days.

This patent is subject to a terminal disclaimer.

(21) Appl. No.: 13/793,345

(22) Filed: Mar. 11, 2013

(65) Prior Publication Data

US 2014/0173348 A1    Jun. 19, 2014

Related U.S. Application Data

(63) Continuation of application No. 13/718,455, filed on Dec. 18, 2012.

(51) Int. Cl.
  *G06F 11/00* (2006.01)
  *G06F 11/26* (2006.01)
  *G06F 17/50* (2006.01)

(52) U.S. Cl.
  CPC .......... *G06F 11/261* (2013.01); *G06F 17/5022* (2013.01)

(58) Field of Classification Search
  CPC .......................... G06F 11/261; G06F 17/5022
  See application file for complete search history.

(56) References Cited

U.S. PATENT DOCUMENTS

| | | |
|---|---|---|
| 5,995,736 A | 11/1999 | Aleksic et al. |
| 6,080,203 A | 6/2000 | Njinda et al. |
| 7,145,921 B2 | 12/2006 | Smyers |
| 7,908,518 B2 * | 3/2011 | West et al. ...................... 714/28 |
| 2004/0216008 A1 * | 10/2004 | Roesner et al. ................. 714/33 |
| 2005/0102640 A1 * | 5/2005 | Iwamoto et al. .................. 716/4 |
| 2009/0204924 A1 * | 8/2009 | West et al. ..................... 715/772 |
| 2009/0235121 A1 | 9/2009 | Mukherjee et al. |

OTHER PUBLICATIONS

U.S. Appl. No. 13/718,455, entitled Firmware Generated Register File for Use in Hardware Validation, filed Dec. 18, 2012.

* cited by examiner

*Primary Examiner* — Charles Ehne
(74) *Attorney, Agent, or Firm* — Patterson & Sheridan, LLP

(57) ABSTRACT

When testing or validating a hardware system, a script file representing a portion of the firmware may be used to test the system instead of using the firmware code itself. For example, the script file may be plurality of register commands that perform the same initialization sequence as the firmware. Before connecting the hardware system to firmware drivers, the script file may be used to debug the initialization sequence. Instead of generating this script file manually, a firmware testing tool may be used. While executing the firmware, the tool may record the different register access commands performed during the initialization process. The script file is then generated programmatically using these recorded commands without requiring input from the system designer. The generated script file may then be tested on the hardware system to determine whether the command sequence in the script file forces the hardware system into the desired state.

8 Claims, 4 Drawing Sheets

FIRMWARE GENERATED REGISTER FILE FOR USE IN HARDWARE VALIDATION

CROSS-REFERENCE TO RELATED APPLICATIONS

This application is a continuation of co-pending U.S. patent application Ser. No. 13/718,455, filed Feb. 27, 2013. The aforementioned related patent application is herein incorporated by reference in its entirety.

BACKGROUND

Designing and fabricating a hardware system typically requires multiple stages of testing. For example, the circuit design of the IC may be first simulated in a completely software-based environment before being fabricated. The simulated hardware is changed as various bugs are identified. Generally, updating simulated hardware is much faster and cheaper than updating a physical hardware system.

In addition to testing and debugging the circuit design, the firmware tasked with initializing and controlling the hardware system may also be tested using a simulator that includes a model of the hardware system. If the firmware causes the simulated model to behave in an unexpected manner, the firmware is changed and re-executed using the simulator. Once the firmware is validated using the simulator, the firmware may be executed on a physical representation of the hardware system—i.e., the IC or a plurality of ICs.

SUMMARY

Embodiments presented herein include a system and computer program product for testing a design of a hardware system. The system and computer program product include executing firmware in a firmware testing tool. The firmware testing tool includes a simulated model of the hardware system, where, while executing the firmware, the firmware testing tool writes data to registers in the simulated model that force the simulated model into a desired state. The method, system, computer program product include recording values written to the registers while executing the firmware. The system and computer program product include converting the recorded values into a plurality of register commands to generate a script, where the script is configured to force a physical representation of the hardware system into the desired state.

BRIEF DESCRIPTION OF THE SEVERAL VIEWS OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
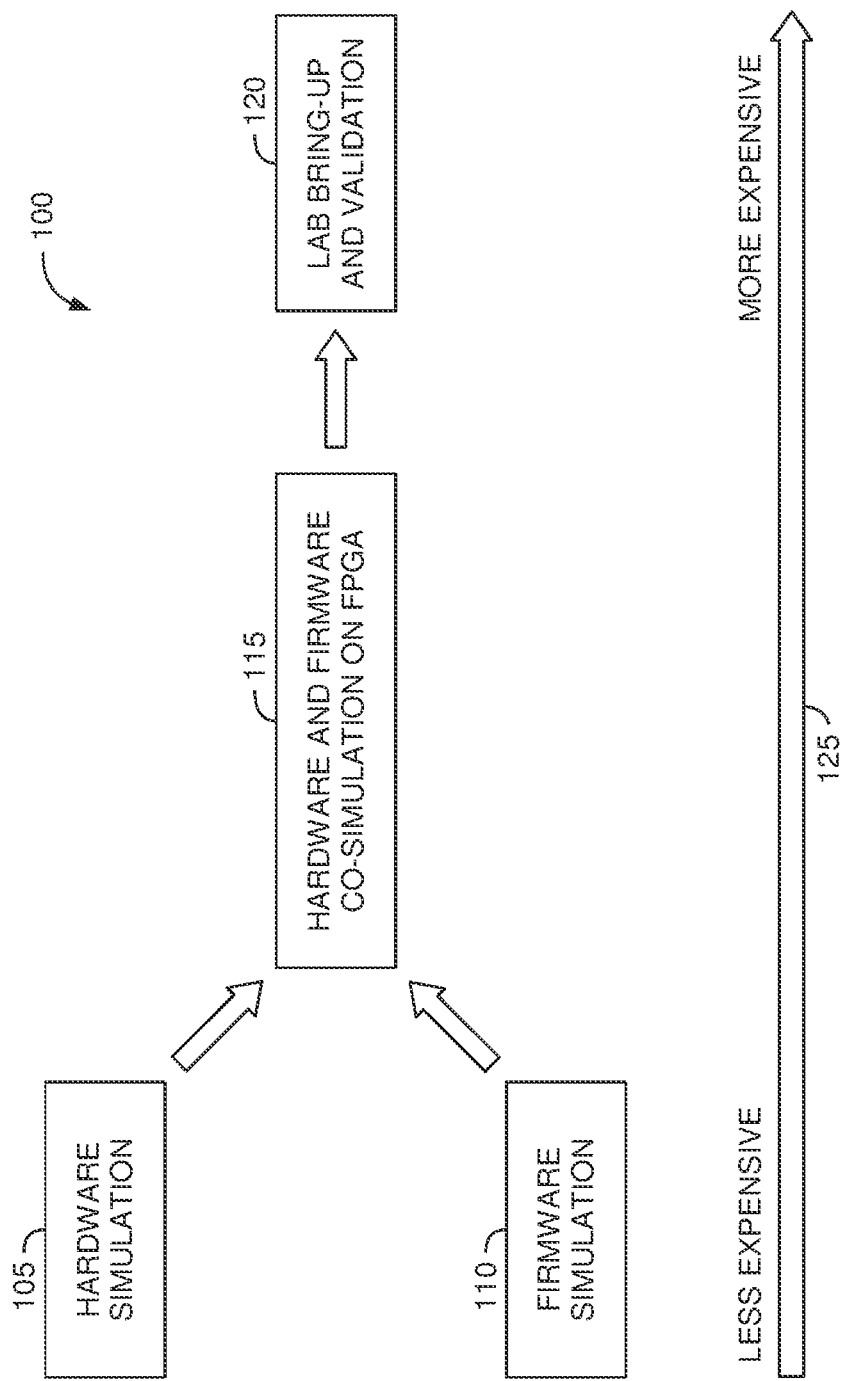
FIG. 1 is a flow chart of testing and validating an embedded system including hardware and firmware, according to one embodiment described herein.

One step in testing and validating a hardware system may include using one or more field-programmable gate arrays (FPGAs) to simulate the circuit design of the hardware system (e.g., an IC, memory, analog circuit components, and the like). An FPGA is a special-purpose hardware system that is designed to be configured by a customer or designer after the FPGA is manufactured. Specifically, a customer or designer uses a hardware description language (HDL) to configure the FPGA to act like the desired hardware design. Accordingly, when a bug is found in the design, the customer can update the HDL and change the configuration of the FPGA. Once the customer/designer is satisfied with the performance of the FPGA, the corresponding circuit design may then be used to fabricate the hardware system that was modeled by the FPGA, for example, an application-specific integrated circuit (ASIC).

When testing the hardware system using the FPGA, a testing apparatus may write values into registers (i.e., blocks of memory) in the FPGA to force the hardware system into a desired state. In one embodiment, the firmware associated with the hardware system is tasked with providing the data values that initialize the system. Because the FPGA may not be connected to firmware drivers when being tested, the system programmers generate a script file (also known as a register file or SCOM file) that has a plurality of register read and write commands that initialize the hardware system in the same manner as the firmware. The commands in the script file are then executed on the FPGA to force the FPGA into the desired state. Thus, the firmware initialization sequence is tested using the script file in lieu of using the firmware itself.

Instead of generating the script files manually, a firmware simulator (i.e., a tool used for testing the functionality of the firmware) may be used to programmatically populate the script file. If the firmware simulator is not used to generate the script file, a programmer must use a reference, such as a programming guide, to determine what data needs to be stored in each register in the FPGA and generate the script file manually. In one embodiment, when the firmware simulator executes the firmware, the tool outputs the plurality of register reads or writes which may be transformed into the script file without requiring input from a programmer. In some cases, programmatically generating the script file may save time and money, especially since the script file may include thousands, if not tens of thousands, of individual register commands. The populated script file may then be tested on the FPGA.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a flow chart 100 of testing and validating an embedded system including hardware and firmware, according to one embodiment described herein. Specifically, the flow chart 100 illustrates a plurality of steps that may be followed to design and verify a hardware system such as one or more ASICs, memory devices, analog circuitry, card components, and combinations thereof. At block 105, the hardware design may be tested and verified using a hardware simulator. For example, the different electric components of an IC—e.g., memory elements, transistors, buffers, buses, and the like—may be modeled in a hardware simulator to verify the operability of the hardware design. The hardware simulator may be a software application that allows the system designers to ensure that the different components communicate properly and perform the desired logic. For example, the hardware simulator may output different timing diagrams or reports that the system designers may use to evaluate and change the layout of the hardware system.

At block 110, the firmware associated with the hardware system may be tested. In one embodiment, the firmware is program code loaded into a memory that may control a hardware system or enable a higher-level software application (e.g., an operating system) to access and use the hardware system. For example, the hardware system and the firmware may be part of an embedded system where the firmware is the control program for the system or provides services for higher-level software. A firmware simulator or firmware testing tool (a software application) may be used to validate the firmware. For example, a system designer may use a reference guide that identifies the different components in the hardware system and their function. The designer may use a programming language (e.g., C, C++, Java, and the like) to develop a model that mimics the function of the components in the hardware system. The firmware simulator may then execute the firmware against the model. Any anomalies (or bugs) in the firmware may be identified based on the results provided by the firmware testing tool.

In one embodiment, the hardware simulation performed in block 105 and the firmware test performed at block 110 may be performed in parallel. That is, instead of waiting until the hardware design has been finalized and implemented on a FPGA before testing the firmware on that design, the firmware may be tested using the firmware simulator as discussed above. In one embodiment, if the hardware design is changed, the model emulating the hardware design in the firmware simulator may also be updated. By performing block 105 and 110 in parallel, the process of validating the hardware system may be streamlined.

At block 115, the hardware design that was tested at block 105 may be used to configure one or more FPGAs using, for example, an HDL (e.g., Verilog, VHDL, and the like). Similar tests may also be executed on the FPGAs that were run using the hardware simulator—e.g., timing diagrams—to identify any errors or possible optimizations to the design of the hardware system. In addition, the firmware tested at block 110 may be tested against the circuit design implemented on the FPGA. For example, the firmware drivers (e.g., computing systems) may be connected to the FPGA to control the hardware elements modeled by the FPGA. Specifically, the firmware drivers serve as an interface between the FPGA and the firmware. The firmware drivers may execute the firmware internally and transmit the resulting control signals to the FPGAs.

In one embodiment, the firmware instructs the simulator to write data values into the registers in the FPGA in order to force the hardware design into an initialized state. As used herein, the portion of the firmware that initializes the hardware system is referred to as the initialization sequence. Before connecting the FPGA to firmware drivers, however, a script file (e.g., a register file or SCOM file) may be used to test the initialization sequence. The script file may use a programming language, such as Perl, to provide the instructions with the data to be loaded into the registers of the FPGA during initialization. However, generating the script file may be an arduous task that requires a programmer to generate thousands, or tens of thousands, of individual register commands (e.g., read/write commands). Moreover, requiring a programmer to code thousands of lines of code may result in human error that causes errors even if the design of the firmware initialization sequence is correct.

Once the testing system verifies that the script properly initializes the FPGA into the correct state (i.e., initializes the hardware system correctly), the FPGA may be connected to firmware drivers to further verify the operation of the hardware/firmware. Stated differently, the script files are generated to verify that the initialization sequence that will be performed by the firmware is correct before the firmware is actually connected to the FPGA (or any hardware element) for testing. Thus, the script files are standalone files that are based on the initialization process the firmware is configured to do when initializing the hardware system. In some testing environments, the physical hardware that the firmware executes on to connect to the FPGAs may not be available but the equipment necessary to send the script is available—e.g., executing the firmware may require special hardware system (firmware drivers) while executing the script may only require a basic computing device. Additionally, another benefit of validating with the script before using the firmware connected to the FPGA is it is easier to isolate a problem in the initialization sequence by first validating the script against the hardware design rather than trying to test both the hardware and firmware at once. In one embodiment, once the script files verify that the initialization process forces the hardware system into the correct state, the firmware drivers are connected to the FPGA.

At block 120, the hardware design tested in block 115 is used to fabricate the hardware system. For example, if the hardware system is an IC, the design may be used to fabricate an ASIC (e.g., an integrated circuit on a silicon substrate). The firmware may be loaded onto the hardware system and proper operation of the combined hardware/firmware system may be verified. Generally, as shown by arrow 125, detecting and fixing bugs in the firmware and hardware is more expensive (and harder) in the latter blocks in chart 100 relative to the earlier blocks. Although the specific example of verifying the circuit design of an ASIC and the firmware that controls the ASIC is provided, the embodiments described herein are not limited to such and may be applied to any hardware system that includes firmware.

Figure 2:
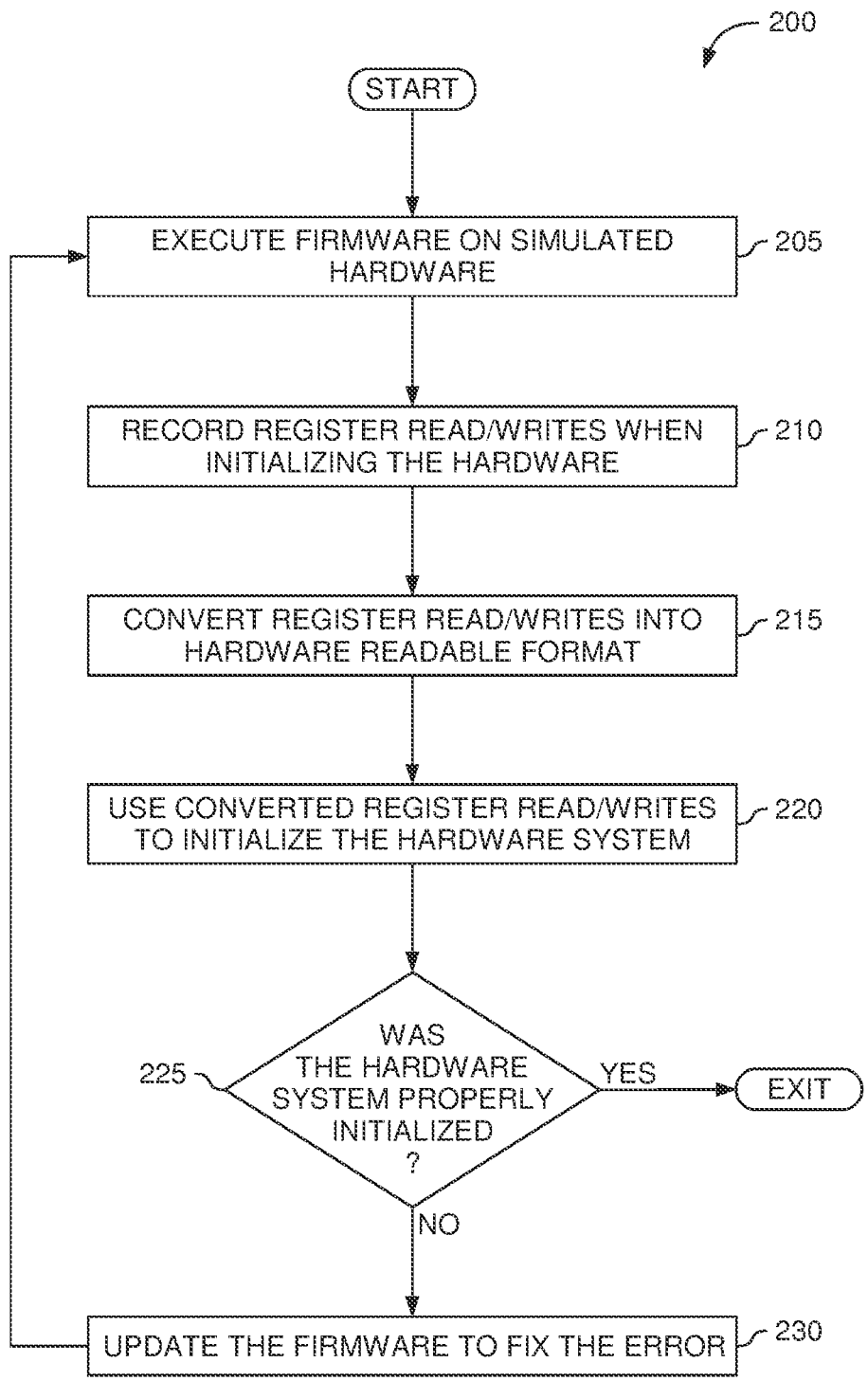
FIG. 2 is a method of testing a hardware system using an output of a firmware simulator, according to one embodiment described herein.

FIG. 2 is a method 200 of testing a hardware system using an output of a firmware simulator, according to one embodiment described herein. Specifically, method 200 may make the hardware validation process shown in FIG. 1 cheaper or faster by using a firmware simulator to populate the script file for testing the firmware initialization sequence. At block 205, the firmware program code is executed on a simulated model of the hardware system. This may be the same process that was described in block 110 of FIG. 1 where the firmware code is executed using a firmware simulator. Specifically, the firmware simulator (e.g., Simics) may aid in testing and configuring the firmware for a particular type of embedded hardware system. To do this, the firmware simulator establishes a simulated hardware environment that is a model of the set-up of the hardware system.

At block 210, the firmware simulator may capture the memory mapped input output (MMIO) read and write commands performed when initializing the hardware system. That is, the firmware simulator records the different register reads and writes required during firmware's initialization sequence. In one embodiment, the firmware may include one or more traces functions that instruct the firmware simulator to record the register read and writes. As mentioned previously, these register reads and writes force the hardware system into a desired state—i.e., initializes the system. For example, the register write commands are used to store information in the registers to put the hardware in a particular state while the read commands may be used to validate that the FPGA hardware model matched what the firmware simulator expected. If the values read from the FPGA registers do not match the expected values during the firmware simulation, the firmware programmer knows that there is an error in either the firmware or the hardware design. The programmer either fixes the hardware issue and recompiles the FPGA or updates the firmware and re-executes the firmware simulation tool to generate a new script.

Instead of the firmware including the trace function, the firmware simulator may have its own trace or monitoring feature that permits the user to access the reads and writes performed on each register. In this manner, the firmware simulator provides access to the specific register commands (e.g., the MMIO commands) that place the hardware system in a particular state, which may include thousands of individual instructions.

At block 215, the register commands resulting from executing the firmware on the firmware simulator are converted into a hardware-readable format. Specifically, the register commands are converted into a script file or SCOM file which may be used to test the firmware initialization sequence on a FPGA. A separate application or process may extract from the register commands the specific hardware register read and write commands which are then used to generate the script file. This process may entail adding program code to the script file that is compatible with the particular hardware system or testing apparatus that transmits the register values to the hardware system during testing. For example, the register read and write commands resulting from the firmware test may include only the actual values that were written to, or read from, the registers. Thus, the application that generates the script file may nest these values in instructions of a program language that is recognizable by the testing apparatus.

In one embodiment, the application may be configured to filter the different register commands to select only a portion of the commands. That is, the trace functions may capture data from extraneous read/write commands such as interrupt bits or data in register that only store data but do not force the hardware system into the desired state. Thus, the application may include logic for parsing the output register commands and selecting the commands that are actually used to place the hardware system in the desired state—e.g., the values that initialize the hardware system. After converting the output register read/write commands to register commands compatible with the testing apparatus, the resulting script file is a hardware simulation test case that may exactly match the register read and write sequence that the firmware would do when putting the hardware system into the desired state.

At block 220, the resulting script file is used to force the hardware system into the desired state, such as initializing the hardware system. Advantageously, instead of requiring a programmer to generate the script file from a programming guide, the file is automatically generated or generated programmatically from the output of one or more trace functions associated with the firmware simulator. Thus, a programmer is no longer required to generate the script file manually for testing the firmware initialization sequence using a program guide.

Figure 3:
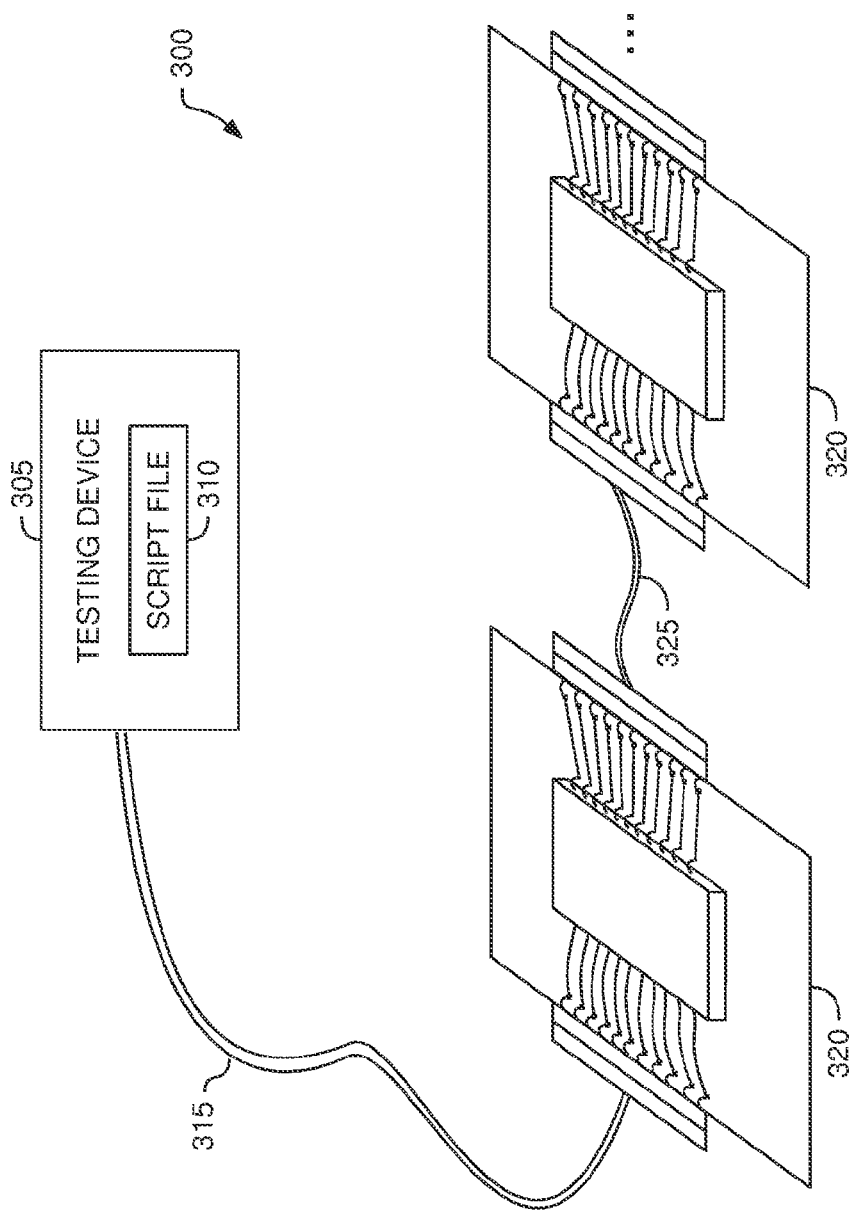
FIG. 3 is a testing system for executing a script on a hardware system, according to one embodiment described herein.

FIG. 3 is a testing system 300 for executing a script on a hardware system, according to one embodiment described herein. The system 300 includes a testing device 305 and one or more FPGAs 320. Although two FPGAs 320 are illustrated, the system 300 may include any number of FPGAs. The testing device 305 may be any type of computing system capable of interfacing with the FPGAs 320 and includes the script file 310 that was generated from the output of the firmware simulator. In one embodiment, the script file 310 includes the necessary instructions for performing the firmware initialization sequence on the FPGAs 320. Thus, the script file may be used to place test the initialization sequence of the firmware before connecting the FPGAs 320 to any firmware driver. Doing so enables the firmware initialization sequence to be tested in isolation. Once the performance of the initialization sequence is verified using the script file 310, in a later testing step, the FPGAs 320 may be connected to firmware driver that can test other aspects of the firmware.

As shown in FIG. 3, the testing device 305 uses communication channel 315 to transmit the register values stored in the script file 310 to at least one of the FPGAs 320. In one embodiment, the testing device 305 may be coupled to a plurality of the FPGAs 320, and thus, transmit register read/write commands to multiple FPGAs 320. Moreover, the FPGAs 320 are coupled to each other via communication channel 325. In some embodiments, the communication channel 325 may be omitted if the only one FPGA is used to model the entire hardware system. However, in other embodiments, multiple FPGAs 320 may be used to model the hardware system. For example, the hardware system may be a single IC that is too complex to model using only one FPGA, thereby requiring multiple FPGAs to model. Alternatively, the hardware system may be a system with a plurality of different, interconnected ICs, requiring multiple FPGAs and communication channels 325. Further, the testing system 300 may include other hardware besides the FPGAs 320 such as analog circuits, memory devices, measuring devices for validating the results of executing the script file 310, and the like.

Although the testing system 300 includes FPGAs 320, in some embodiments, using FPGAs to model the hardware system may be skipped. For example, the testing device 305 may be connected to actual components of the hardware system to validate the firmware initialization sequence without first testing the initialization sequence using FPGAs. Moreover, the script file may also be used as input for a hardware simulator (e.g., block 105 of FIG. 1) for determining if the script forces the simulated hardware system into the desired state. In another embodiment, the script file may be sent to a hardware simulator to be tested against the simulated hardware. For example, the script file may be used in block 105 of FIG. 1 to test the firmware portion using the simulated hardware in that simulator.

Returning to FIG. 2, at block 225, the testing system may indicate whether the script file properly initialized the hardware system. For example, the script file may store a certain value in a register that is expected to cause a certain action. The testing system may monitor other registers to determine whether the action occurred. If the expected action did not occur, this may indicate that there is a problem with the firmware initialization sequence. Thus, at block 230, the firmware programmer may review the error, correlate the error to a portion of the firmware code, and fix the firmware code to prevent further occurrences of the error.

In one embodiment, the updated firmware is re-executed on the firmware simulator (block 205) which may generate different register read/write commands. These commands are again converted into a script file (at block 210) which can be used to test the initialization sequence using the physical hardware system—e.g., one or more FPGAs. Advantageously, each time the validation process of method 200 discovers an error in the firmware, only the firmware code must be updated by a programmer. Once the firmware is re-executed on the firmware simulator, an updated script file is programmatically generated based on the trace function. In this manner, the programmer updates only the firmware rather than having to update both the firmware and the script file. Thus, using the output of the firmware simulator to generate the script file may save time when first generating the script file and when updating the script file to fix errors in the initialization sequence.

Once the testing system determines that the hardware system was properly initialized, method 200 may stop. In one embodiment, after ensuring that the firmware initialization sequence functions properly using method 200, the firmware and hardware may be co-validated as shown in block 115 of FIG. 1. For example, the FPGA may be attached to firmware drivers that test to ensure proper functionality of all the firmware, including the initialization sequence. Additionally, the firmware may be tested during a lab bring-up stage of the validation process.

Figure 4:
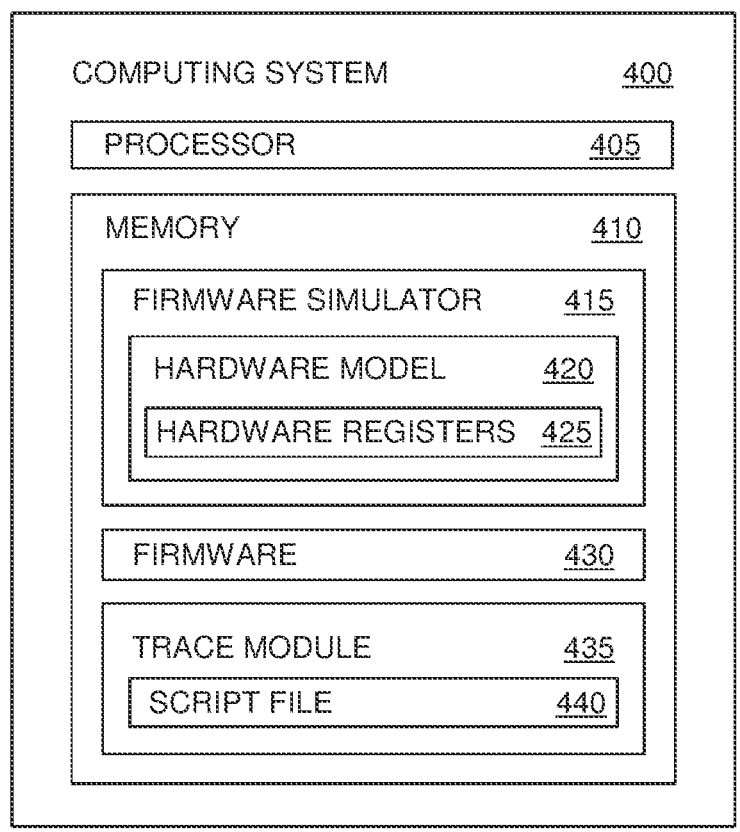
FIG. 4 is a computing system for generating a script for testing a hardware system using a firmware simulator, according to one embodiment described herein.

FIG. 4 is a computing system 400 for generating a script for testing a hardware system using a firmware simulator, according to one embodiment described herein. The computing system 400 includes a processor and memory 410 for validating a firmware initialization sequence. The processor 405 may be any processor unit capable of performing the functions described herein. The processor 405 may represent one or more physical processor units and may have one or more processor cores. The memory 410 may include volatile or non-volatile memory units such as Flash memory, RAM, hard disk drives, and the like. Moreover, memory 410 may include different levels of cache memories as well as internal or external storage elements.

Memory 410 includes a firmware simulator 415, firmware 430, and trace module 435. In one embodiment, the firmware simulator 415 is a software application that executes firmware on a simulated hardware system—e.g., hardware model 420. The model 420 may include one or more modules that are configured (i.e., programmed) to mimic the function of one or more components in the hardware system. For example, the hardware system may include a routing table that, based on information in a received network packet, forwards the packet to a selected destination. Based on the specification of the routing table, a user may use a programming language (e.g., C, C++, Java®, and the like) to design one or more modules that perform the same function as the routing table. Moreover, the modules of the hardware model 420 may be designed to transmit and receive data much like the different components in a physical hardware system. The hardware model 420 may also include simulated hardware registers 425 that perform the same function as physical registers in the hardware system. For example, the firmware simulator 415 may perform different read or write commands using the registers 425 which force the hardware model 420 into a desired state. As mentioned previously, the firmware simulator 415 may transmit certain data to the registers to put the hardware model into an initialized state. In this manner, an entire hardware system may be modeled by the firmware simulator 415.

Firmware 430 is computer code that controls one or more aspects of the hardware system. The firmware 430 may be executed by the firmware simulator 415 against the hardware model 420. The inputs and outputs of the hardware registers 425 may be monitored to see if the firmware 430 correctly controls the hardware model 420. If not, the firmware 430 may be updated to ensure correct behavior. This process of executing the firmware 430 using the simulator 415, reviewing the results, and updating the firmware 430 may be repeated until most or all of the bugs have been fixed. Moreover, as shown in FIG. 1, validating the firmware using the firmware simulator 415 may be performed at the same time that the hardware is validated using a hardware simulator. Accordingly, any changes in the hardware design resulting from the hardware simulations may be used to update the hardware model 420.

In one embodiment, the firmware 430 at least includes a sequence that initializes (e.g., "boots up") the hardware system. It may be desirable to test or validate this initialization sequence independent of the other functions performed by the firmware 430. To validate the initialization sequence, a testing system may use a plurality of register read and write commands in a script file that are similar in function as the initialization sequence included in the firmware 430. Instead of requiring a programmer to generate the script file 440 from a programming guide, the trace module 435 may be used to generate the script file 440 programmatically. The trace module 435 may be part of the firmware 430, a function of the firmware simulator 415, or an independent application that monitors the current values being written in, and read from, the simulated hardware registers 425 when the firmware 430 is being executed. Based on these values, the trace module 435 (or a separate application) generates the script file 440 by converting the hardware read/write commands into a programming language readable by, for example, a testing apparatus. For example, the trace module 435 may monitor the data values being written into one or more of the registers and use the values to generate register commands that write the same values in the same order on physical registers in a hardware system. In one embodiment, the commands may be based on a programming language that is compatible with a testing system (not shown) connected to an FPGA or an ASIC. The testing system may use the script file 440 to force the hardware system into a specific state—e.g., to initialize the hardware system.

If the testing system reports that the script file 440 did not place the hardware system into the correct state, the firmware programmer may update the firmware 430 to fix any identified errors. When the updated firmware 430 is being re-executed using the firmware simulator 415, the trace module 435 may again record the values written to, and read from, the registers 425. Based on these values, the trace module 435 may generate a new script file 440 (or update the current script file) that includes register commands with the new register values. The testing system may use the update script file 440 to test the firmware 430. Because the script file 440 is generated based on executing the firmware, once the testing system determines the script file 440 properly initializes the hardware system, the user knows that the initialization sequence portion of the firmware 430 will also properly initialize the hardware system.

In one embodiment, the trace module 435 may select only certain registers 425 or only certain register values to add to the script file 440. For example, some of the registers 425 in the hardware module 420 may only store data, and thus, including those register values in the script file may not be needed. Or only certain values stored in register 425 may be unimportant while previous or subsequent values stored in a register 425 are important. For example, a particular register 425 may store a value used to initialize a routing table in the hardware module but later store an interrupt bit. The first value may be included in a register command in the script file 440 while the second value is not. The application that generates the script file 440 may include logic for selecting which register read/write commands performed by the firmware simulator 415 should be converted into register commands in the script file 440.

Although the embodiments described above specifically mention generating a separate script file based on a firmware initialization sequence, the present disclosure is not limited to such. Instead, any portion of the firmware (or even the entire firmware code) may be executed in a firmware simulator where the resulting register read and write commands are used to generate a script file. The resulting script file may the used to test the firmware portion either using a physical hardware system (e.g., a FPGA) or a simulated hardware system in a hardware simulator.

CONCLUSION

One step in testing and validating a hardware system may include using one or more FPGAs to simulate the circuit design of the hardware system. When testing the hardware system using the FPGA, the testing system may write values into the registers in the FPGA to force the hardware system into a desired state. In one embodiment, the firmware associated with the hardware system is tasked with providing the data values that initialize the system. Because the FPGA may not be connected to the firmware drivers when being tested, the system programmers generate a script file (e.g., a register file or SCOM file) that has a plurality of register read and write commands. The register commands in the script file are then executed on the FPGA to force the FPGA into the desired state—i.e., initialize the hardware system.

Instead of generating the script files manually, a firmware simulator may be used to populate the script file. If the firmware simulator is not used to generate the script file, a programmer must use a reference, such as a programming guide, to determine what data needs to be stored in each register in the FPGA and generate the script file manually. In one embodiment, when the firmware simulator executes the firmware, the tool outputs the plurality of register reads or writes which may be transformed into the script file without requiring input from a programmer. The programmatically generated script file may then be tested on the FPGA.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method of testing a design of a hardware system, comprising:
   executing firmware in a firmware testing tool, the firmware testing tool comprising a simulated model of the hardware system, wherein, while executing the firmware, the firmware testing tool writes data to registers in the simulated model that force the simulated model into a desired state;
   recording values written to the registers while executing the firmware; and
   converting the recorded values into a plurality of register commands to generate a script, wherein the script is configured to, when executed on a testing apparatus, force a physical representation of the hardware system into the desired state.

2. The method of claim 1, further comprising, upon determining that the script does not force the physical representation of the hardware system into the desired state:
   executing updated firmware in the firmware testing tool;
   recording new values written to the registers while executing the updated firmware; and
   converting the new values into a different plurality of register commands to generate a new script.

3. The method of claim 1, wherein the script is configured to be used by the testing apparatus to write values to registers in the physical representation of the hardware system.

4. The method of claim 1, wherein the plurality of register commands in the script is arranged in a sequence configured to force the physical representation of the hardware system into an initialized state.

5. The method of claim 1, further comprising, before converting the recorded values into the plurality of register commands, filtering the recorded values to select only a portion of the recorded values based on whether the recorded values are used to force the hardware system into the desired state.

6. The method of claim 1, wherein the physical representation of the hardware system is at least one of: a field-programmable gate array (FPGA) configured to model at least a portion of the hardware system and an application-specific integrated circuit (ASIC) of the hardware system.

7. The method of claim 1, wherein the script is configured to be used in a hardware simulator for forcing a simulated hardware system into the desired state.

8. The method of claim 1, wherein the plurality of register commands in the script is programmatically generated without input from a user.

* * * * *